United States Patent
Tanaka et al.

(10) Patent No.: US 10,658,359 B2
(45) Date of Patent: May 19, 2020

(54) SEMICONDUCTOR DEVICE

(71) Applicant: Mitsubishi Electric Corporation, Tokyo (JP)

(72) Inventors: Koji Tanaka, Tokyo (JP); Fumihito Masuoka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/153,999

(22) Filed: Oct. 8, 2018

(65) Prior Publication Data

US 2019/0181138 A1    Jun. 13, 2019

(30) Foreign Application Priority Data

Dec. 11, 2017    (JP) .................. 2017-236834

(51) Int. Cl.
  *H01L 27/07*    (2006.01)
  *H01L 29/66*    (2006.01)
  *H01L 29/417*    (2006.01)
  *H01L 29/49*    (2006.01)
  *H01L 29/739*    (2006.01)
  *H01L 29/861*    (2006.01)
  *H01L 29/16*    (2006.01)
  *H01L 29/20*    (2006.01)

(52) U.S. Cl.
  CPC .... *H01L 27/0716* (2013.01); *H01L 29/41708* (2013.01); *H01L 29/4958* (2013.01); *H01L 29/66136* (2013.01); *H01L 29/7395* (2013.01); *H01L 29/861* (2013.01); *H01L 29/1608* (2013.01); *H01L 29/2003* (2013.01)

(58) Field of Classification Search
  CPC .......... H01L 27/0716; H01L 29/41708; H01L 29/4958; H01L 29/7395; H01L 29/861
  See application file for complete search history.

(56) References Cited

U.S. PATENT DOCUMENTS 7,952,143 B2 *  5/2011  Soeno .................. H01L 27/0664
                                                    257/133
8,159,039 B2 *  4/2012  Cheng ................. H01L 29/0634
                                                    257/481

(Continued)

FOREIGN PATENT DOCUMENTS

JP    H04-324931 A    11/1992
JP    H08-111455 A    4/1996

*Primary Examiner* — Fernando L Toledo
*Assistant Examiner* — Neil R Prasad
(74) *Attorney, Agent, or Firm* — Studebaker & Brackett PC

(57) ABSTRACT

A semiconductor device, which is a diode, includes the following: an n cathode layer, which is an n-type region, disposed in a surface layer of a semiconductor substrate; a p cathode layer, which is a p-type region, disposed in the surface layer; and a cathode electrode, which is a metal electrode, in contact with both of the n cathode layer and the p cathode layer. The cathode electrode includes a first metal layer in contact with both of the n cathode layer and the p cathode layer, and a second metal layer disposed on the first metal layer. A contact surface between the first metal layer and the second metal layer has an oxygen concentration lower than the oxygen concentration of a contact surface between the first metal layer, and the n cathode layer and the p cathode layer.

6 Claims, 1 Drawing Sheet

(56) References Cited

U.S. PATENT DOCUMENTS

2014/0225126 A1* 8/2014 Aketa ............... H01L 29/41766
   257/77
2016/0087043 A1* 3/2016 Shimizu ............. H01L 29/1608
   257/77

* cited by examiner

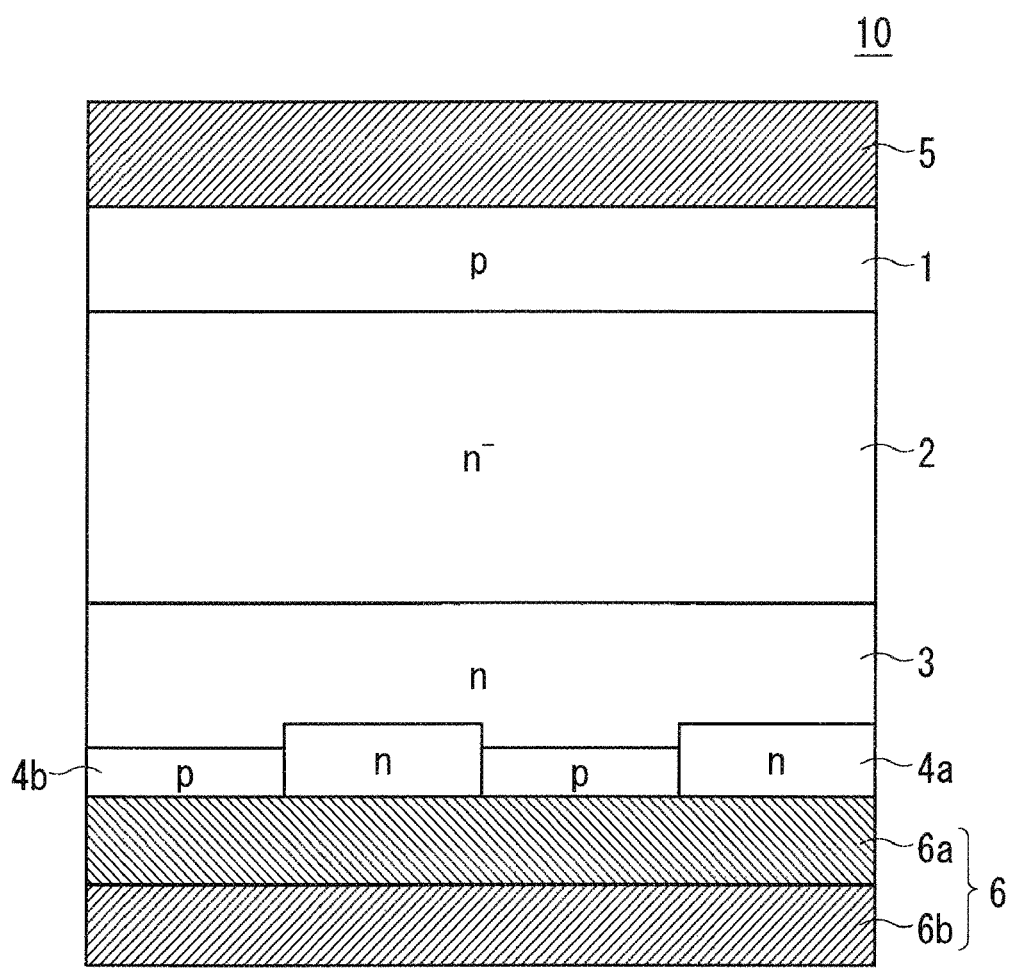

SEMICONDUCTOR DEVICE

BACKGROUND OF THE INVENTION

Field of the Invention

The present invention relates to power semiconductor devices.

Description of the Background Art

A known power semiconductor device, such as a diode or a reverse-conducting insulated gate bipolar transistor (RC-IGBT), includes n-type and p-type regions disposed in one surface layer of a semiconductor substrate, and a metal electrode in contact with both of the n-type and p-type regions.

Japanese Patent Application Laid-Open No. 4-324931 discloses a technique of electrode formation by adjusting the thickness of a natural oxide film that has grown on a surface of a silicon substrate to be the order of 5 to 15 Å, forming a metal film reactive to oxygen onto the surface of the silicon substrate, and further forming a nickel film onto the metal film. Japanese Patent Application Laid-Open No. 8-111455 discloses a technique of successive formation of two metal layers under vacuum, thereby preventing a natural oxide film from being formed between the metal layers.

For instance, provided is a diode, or a semiconductor device, with a pattern of p-type and n-type regions positioned on the cathode side of the diode. Such a semiconductor device includes a metal electrode in ohmic contact with both of the n-type and p-type regions. Reducing the forward voltage (VF) of the diode requires reduced contact resistance (ohmic resistance) between the metal electrode and the n-type and p-type regions; thus, material selection for the metal electrode is important.

In such a diode, the metal electrode in contact with the n-type and p-type regions has a multi-layer structure made of different metals. In the metal electrode with such a multi-layer structure, a metal layer in contact with the n-type and p-type regions can be apt to undergo oxidation. Then, the metal layer has an oxidized surface, thus increasing the ohmic resistance between the metal electrode and the n-type and p-type regions. Unfortunately, this can raise the forward voltage of the diode.

SUMMARY

An object of the present invention is to provide a semiconductor device reducing the ohmic resistance of a metal electrode that is in contact with both n-type and p-type regions.

A semiconductor device according to the present invention includes an n-type region and a p-type region that are disposed in a surface layer of a semiconductor substrate, and a metal electrode in contact with both of the n-type region and the p-type region. The metal electrode includes a first metal layer in contact with both of the n-type region and the p-type region, and a second metal layer disposed on the first metal layer. A contact surface between the first metal layer and the second metal layer has an oxygen concentration lower than the oxygen concentration of a contact surface between the first metal layer, and the n-type region and the p-type region.

The present invention reduces the ohmic resistance between the metal electrode and the n-type and p-type regions.

These and other objects, features, aspects and advantages of the present invention will become more apparent from the following detailed description of the present invention when taken in conjunction with the accompanying drawings.

BRIEF DESCRIPTION OF THE DRAWING

The FIGURE is a cross-sectional view of the structure of a semiconductor device according a preferred embodiment of the present invention.

DESCRIPTION OF THE PREFERRED EMBODIMENT

The FIGURE is a cross-sectional view of the structure of a semiconductor device according a preferred embodiment of the present invention. In the present preferred embodiment, an example of the semiconductor device is a diode made of silicon (Si).

As illustrated in the FIGURE, a semiconductor device 10 includes the following: a p anode layer 1, which is a p-type region, disposed in the surface layer of the upper surface of a semiconductor substrate; an $n^-$ drift layer 2, which is an $n^-$-type region, disposed under the p anode layer 1; an n buffer layer 3, which is an n-type region, disposed under the $n^-$ drift layer 2; an n cathode layer 4a, which is an n-type region, disposed under the n buffer layer 3; and a p cathode layer 4b, which is a p-type region, disposed under the n buffer layer 3. The n cathode layer 4a and the p cathode layer 4b reach the lower surface (back surface) of the semiconductor substrate. That is, the n cathode layer 4a and the p cathode layer 4b are disposed in the surface layer of the back surface of the semiconductor substrate.

Disposed on the upper surface of the semiconductor substrate is an anode electrode 5 in ohmic contact with the p anode layer 1. Disposed on the back surface of the semiconductor substrate is a cathode electrode 6 in ohmic contact with both of the n cathode layer 4a and the p cathode layer 4b. Accordingly, the n cathode layer 4a and the p cathode layer 4b are short-circuited through a first metal layer 6a.

The cathode electrode 6 has a multi-layer structure composed of the first metal layer 6a in contact with both of the n cathode layer 4a and the p cathode layer 4b, and a second metal layer 6b disposed on the first metal layer 6a (under the first metal layer 6a in the FIGURE). The first metal layer 6a is made of aluminum (Al) or an Al—Si alloy, or made of nickel (Ni) or a Ni—Si alloy. The first metal layer 6a is in ohmic contact with the n cathode layer 4a and the p cathode layer 4b. The second metal layer 6b is made of a metal different from that of the first metal layer 6a, and is in ohmic contact with the first metal layer 6a.

In the present preferred embodiment, the surfaces of the first metal layer 6a have low oxygen concentrations in order to reduce the ohmic resistance between the first metal layer 6a, and the n cathode layer 4a and the p cathode layer 4b, and to reduce the ohmic resistance between the first metal layer 6a and the second metal layer 6b. However, a natural oxide film is formed onto surfaces of the n cathode layer 4a and the p cathode layer 4b before the first metal layer 6a is formed. Hence, a contact surface between the first metal layer 6a, and the n cathode layer 4a and the p cathode layer 4b has an oxygen concentration higher than the oxygen concentration of a contact surface between the first metal layer 6a and the second metal layer 6b. That is, $c1 > c2$ is established, where c1 is the oxygen concentration of the contact surface between the first metal layer 6a, and the n cathode layer 4a and the p cathode layer 4b, where c2 is the oxygen concentration of the contact surface between the first metal layer 6a and the second metal layer 6b. Conversely, the present preferred embodiment requires the contact surface between the first metal layer 6a and the second metal layer 6b to have a low oxygen concentration to such an extent that c1>c2 is established. It is noted that c1 is preferably the order of 1/10 to 1/100 with respect to Al, and c2 is preferably the order of 1/1000 or less with respect to Al.

The following describes a method for simultaneous, oxygen concentration lowering in such a manner that the oxygen concentration of the contact surface between the first metal layer 6a and the second metal layer 6b is lower than the oxygen concentration of the contact surface between the first metal layer 6a, and the n cathode layer 4a and the p cathode layer 4b (in other words, a method for establishing c1>c2).

For instance, such a method includes removing the natural oxide film on the back surface of the semiconductor substrate, on which the n cathode layer 4a and the p cathode layer 4b is formed, and then successively forming, through sputtering, the first metal layer 6a and the second metal layer 6b within the same chamber under vacuum.

Alternatively, the method may include removing the natural oxide film on the back surface of the semiconductor substrate, on which the n cathode layer 4a and the p cathode layer 4b is formed, then forming the first metal layer 6a through sputtering, and then removing a natural oxide film on a surface of the first metal layer 6a through a pretreatment, immediately followed by forming the second metal layer 6b through sputtering.

Alternatively, the method may include removing the natural oxide film on the back surface of the semiconductor substrate, on which the n cathode layer 4a and the p cathode layer 4b is formed, then forming the first metal layer 6a through sputtering, and then replacing the surface of the first metal layer 6a with a zinc (Zn) layer while removing the natural oxide film on the surface of the first metal layer 6a using a chemical solution, followed by replacing the Zn layer with the second metal layer 6b.

The present preferred embodiment reduces the ohmic resistance between the first metal layer 6a, and the n cathode layer 4a and the p cathode layer 4b, and reduces the ohmic resistance between the first metal layer 6a and the second metal layer 6b. In other words, the present preferred embodiment reduces the ohmic resistance of the cathode electrode 6, composed of the first metal layer 6a and the second metal layer 6b, thereby lowering the forward voltage of the diode.

A common material such as Al, an Al—Si alloy, Ni, or a Ni—Si alloy, which is contained in the first metal layer 6a, has no unfavorable effect on the electrode properties (e.g., adhesion, solderability, and other properties) of the cathode electrode 6 other than ohmic resistance.

The first metal layer 6a may be made of any of Al, an Al—Si alloy, Ni, and a Ni—Si alloy. However, when the first metal layer 6a is made of Al or an Al—Si alloy, Al contributes, as a dopant, to a reduction in the impurity concentration of the n cathode layer 4a, thus possibly raising the forward voltage of the diode. In contrast, when the first metal layer 6 is made of Ni or a Ni—Si alloy, Ni does not contribute as a dopant, thus lowering the forward voltage of the diode when compared to Al or an Al—Si alloy.

Although Si is used as a semiconductor material in the present preferred embodiment, using a wide bandgap semiconductor, such as silicon carbide (SiC) or gallium nitride (GaN), instead achieves a similar effect. A semiconductor device made of the wide bandgap semiconductor operates under higher voltage, larger current, and higher temperature than a semiconductor device made of Si.

The semiconductor device, although being a diode in the present preferred embodiment, may be any other semiconductor device, such as an RC-IGBT, that includes a metal electrode in contact with a pattern composed of n-type and p-type regions. Such a semiconductor device achieves a similar effect. An RC-IGBT is a device with an IGBT and a freewheeling diode (FWD) integrated into one chip. When the present preferred embodiment is applied to the RC-IGBT, the p cathode layer 4b is the collector of the IGBT, and the n cathode layer 4a is the cathode of the FWD.

It is noted that in the present invention, the preferred embodiment can be modified and omitted as appropriate within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
an n-type region and a p-type region that are disposed in a surface layer of a semiconductor substrate; and
a metal electrode in contact with both of the n-type region and the p-type region, wherein
the metal electrode includes
a first metal layer in contact with both of the n-type region and the p-type region, and
a second metal layer disposed on the first metal layer,
a contact surface between the first metal layer and the second metal layer has an oxygen concentration lower than an oxygen concentration of a contact surface between the first metal layer, and the n-type region and the p-type region,
the first metal layer is made of Al or an Al—Si alloy,
the oxygen concentration of the contact surface between the first metal layer and the n-type region and the p-type region is a value from 1/10 to 1/100 with respect to Al in the first layer, and
the oxygen concentration of the contact surface between the first metal layer and the second metal layer is 1/1000 or less with respect to Al in the first metal layer.

2. The semiconductor device according to claim 1, wherein
the first metal layer is in ohmic contact with both of the n-type region and the p-type region, and
the second metal layer is in ohmic contact with the first metal layer.

3. The semiconductor device according to claim 1, wherein the semiconductor device is a diode including the n-type region and the p-type region on a cathode side of the diode.

4. The semiconductor device according to claim 2, wherein the semiconductor device is a diode including the n-type region and the p-type region on a cathode side of the diode.

5. The semiconductor device according to claim 1, wherein the semiconductor device is an RC-IGBT including an IGBT having the p-type region as a collector, and a diode having the n-type region as a cathode.

6. The semiconductor device according to claim 2, wherein the semiconductor device is an RC-IGBT including an IGBT having the p-type region as a collector, and a diode having the n-type region as a cathode.

* * * * *